United States Patent
Dooley

(12) 
(10) Patent No.: US 6,416,352 B1
(45) Date of Patent: Jul. 9, 2002

(54) TELECOMMUNICATION APPARATUS TEST MODULE WITH DEFLECTABLE CIRCUIT SWITCHING CONTACT

(75) Inventor: Andrew Philip Charles Dooley, Hildenborough (GB)

(73) Assignee: Channell Limited, Orpington (GB)

( * ) Notice: Subject to any disclaimer, the term of this patent is extended or adjusted under 35 U.S.C. 154(b) by 0 days.

(21) Appl. No.: 09/402,811

(22) PCT Filed: Apr. 8, 1998

(86) PCT No.: PCT/GB98/00870

§ 371 (c)(1), (2), (4) Date: Feb. 17, 2000

(87) PCT Pub. No.: WO98/45897

PCT Pub. Date: Oct. 15, 1998

(30) Foreign Application Priority Data

Apr. 9, 1997 (GB) ................................. 9707175
Feb. 16, 1998 (GB) ................................. 9803076

(51) Int. Cl.$^7$ ............................................. H01R 11/18
(52) U.S. Cl. ...................................................... 439/482
(58) Field of Search ................................ 439/482, 912

(56) References Cited

U.S. PATENT DOCUMENTS 4,476,400 A    10/1984   Jo et al. .................... 307/147
5,399,100 A  * 3/1995   Dooley et al. .............. 439/482

FOREIGN PATENT DOCUMENTS

EP    0 710 040 A    5/1996
GB    2 260 036 A    3/1993
GB    2 261 773 A    5/1993
WO    WO 93 07654 A  4/1993

* cited by examiner

Primary Examiner—Neil Abrams
(74) Attorney, Agent, or Firm—Lahive & Cockfield, LLP

(57) ABSTRACT

A telecommunication apparatus comprising an external plastics casing containing a conductive path for a telecommunications signal. The casing includes an aperture providing access to the test contact member using a typical crocodile clip. The conduction path may take various forms. One such example is a contiguous path adjacent the test contact member (26) but not in contact with the test contact member except when in a test position. This enables an engineer to test a telephone line by simply clipping a crocodile clip onto the test contact member and a wall member. A second form of the apparatus provides for a pair of conductors not in mutual contact but each in contact with the test contact member when the latter is in the rest position. When the test contactor is in a test position, only one of the pair of conductors is in contact with the test contact member. A third form of the apparatus includes a pair of conductors not in mutual contact, but each in contact with a third conductive member when in its rest position. None of these three elements are in contact with the test contact member when the latter is in its rest position. Upon deflection of the test contact member to a test position, the test contact member is brought into contact with the third conductive member thereby causing same to be deflected from its rest position to a test position in which it is not in contact with a least one of the pair of conductors.

20 Claims, 5 Drawing Sheets

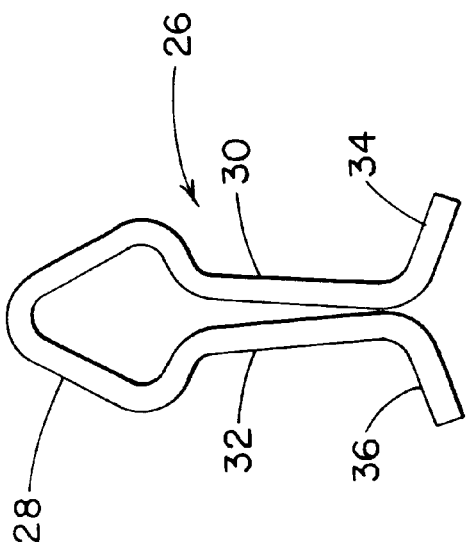
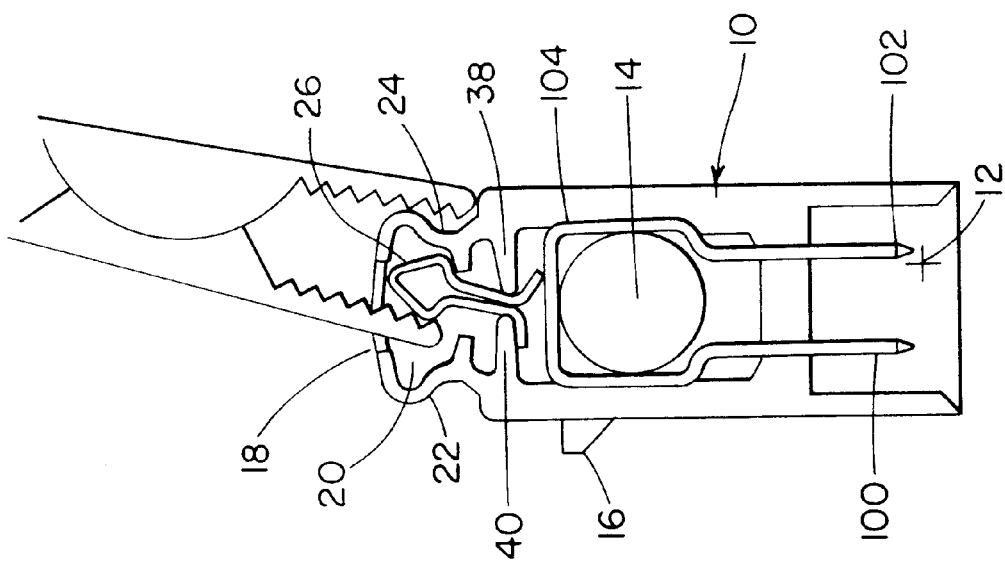

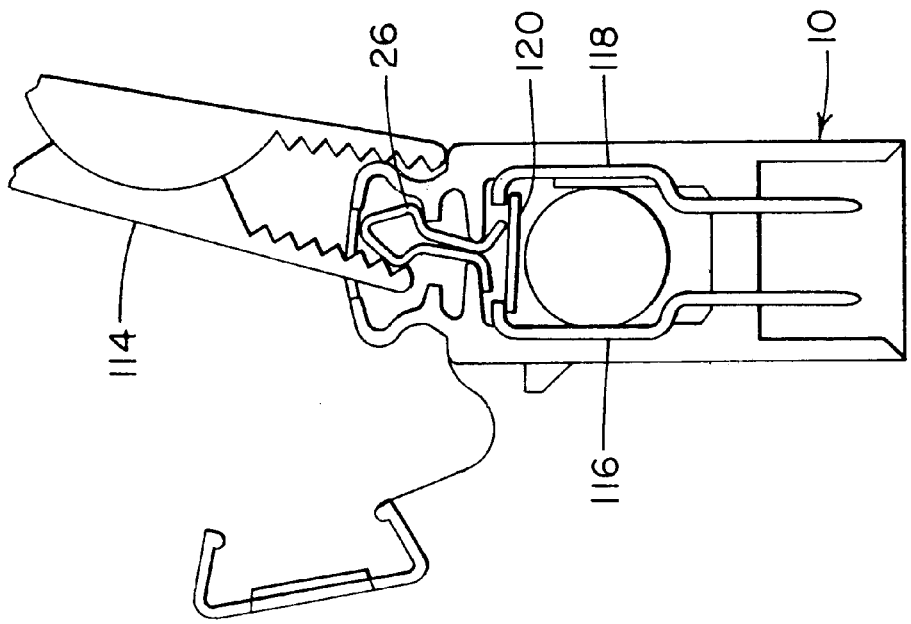
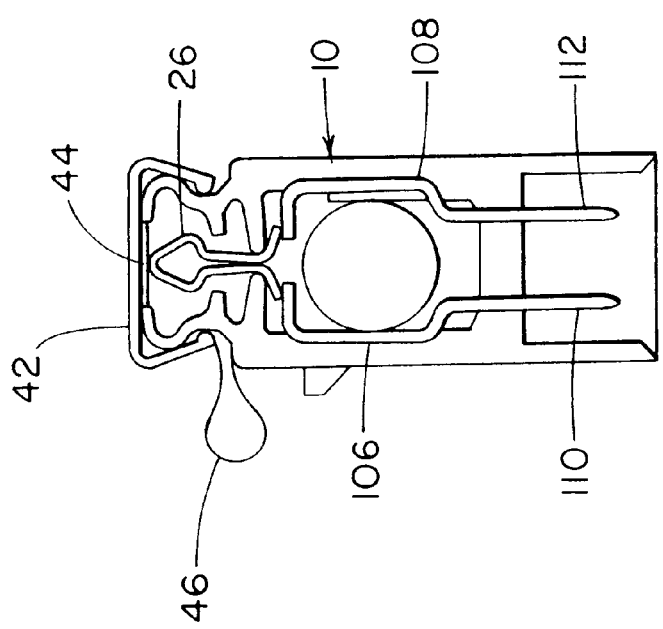

TELECOMMUNICATION APPARATUS TEST MODULE WITH DEFLECTABLE CIRCUIT SWITCHING CONTACT

The present invention relates to telecommunications apparatus

A telecommunications system normally consists of telephone cables carrying signals from the exchange to subscribers. These cables can be run in suitable conduits or suspended between telephone poles. At intervals along the cable, it is necessary to create a spur leading away from a main cable to an individual subscriber. At one time, telephone cables were almost universally suspended between telegraph poles and therefore the spur was referred to as a "drop wire". Similarly, the main cable arriving from the telephone exchange was referred to as the exchange wire.

It is necessary to create a reliable connection between the exchange wire and the drop wire, and many proposals have been made in the past as to how to do so. In particular, our earlier Patent Applications GB-A-2129630, GB-A-2176062 and EP-A-0683925 deal with suitable connection units.

It is of course necessary to test the circuit after installation and when faults are reported. The generally harsh environment of many telephone cables means that care must be taken to protect the conductive elements even during testing, and our earlier Patent Applications GB-A-2260036 and GB-A-2261773 address this problem.

A further consideration in providing test access is that telephone companies wish to avoid third parties gaining undetected access to the test points. This would enable them to tap into an existing telephone line and either eavesdrop or gain free use of the telephone system. Some telephone companies seek a "look both ways" capability in their test access. This refers to the ability of the engineer to break the connection at the test point and connect the test probe either to the side of the connection leading back to the exchange, or to the side leading forward to the subscriber. Thus, an independent test can be carried out of these separate circuits. Those telephone companies which require this also prefer an engineer to test the circuit to identify any signals present on that line prior to disconnection.

Our earlier EP-A-0683925 describes a modular form of apparatus, in which a permanent physical connection can be made between contacts within the unit and the exchange wire and drop wire respectively. A further discrete plug-in module can then be added to the unit to perform a variety of functions. At its simplest level, the module can provide direct interconnection between the exchange wires and drop wires. This could later be replaced for testing purposes with an open accessible connection, for example. It is expected that this modular form will become more prevalent in telecommunication systems, and therefore the present application is described in the form of a suitable module. It should however be understood that the present invention is not limited to use in such modules and could easily be applied to a larger telecommunications apparatus.

In its first aspect, the present invention addresses the difficulty of providing suitable apparatus for a variety of telecommunications companies that exist. In general, the precise requirements of each telephone company is set without reference to the other existing companies, and this means that different markets in different countries call for different specifications and equipment. The natural result of this is that the design of the particular equipment concerned must be different, and this necessitates a plurality of production lines. This means that the investment necessary to produce such products is significantly higher than would be desired.

The present invention therefore seeks to provide a telecommunications apparatus in which those components which require a significant investment cost can be used regardless of the specification laid down by the telecommunications firm. In this aspect of the invention, only parts not requiring a significant investment income need be changed in order to adapt the apparatus to a different specification.

The present invention therefore provides, in its first aspect, a telecommunications apparatus comprising an external plastics casing containing a conductive path for a telecommunications signal, and a test contact within the casing comprising an electrically conductive member, the casing including a pair of wall members and an aperture therebetween providing access to the test contact member, thereby allowing a test probe to be attached to the test contact member and one wall member thereby deflecting the test contact member from a rest position towards a test position;

the conductive path being one selected from (a) a contiguous path adjacent the test contact member but not in contact therewith except when the latter is in a test position;

(b) a pair of conductors not in mutual contact but each in contact with the test contact member when the latter is in the rest position, one of the pair only being in contact with the test contact member when the latter is in a test position;

(c) a pair of conductors not in mutual contact but each in contact with a third conductive member when in its rest position, none of the three being in contact with the test contact member when the latter is in its rest position, deflection of the test contact member to a test position bringing it into contact with the third conductive member and causing same to be deflected from its rest position to a test position in which it is not in contact with at least one of the pair of conductors;

(d) a continuous path not in contact with the test contact member when the latter is in the rest position, which is broken when the test contact member is in the test position, one part of the path then being in contact with the test contact member.

Apparatus is therefore provided which includes the same external plastics casing and test contact member and which can be adapted to the specification required by replacement of the members forming the conductive path. These members are preferably formed of a suitable deformed metal strip, which does not require expensive or elaborate moulds.

In a preferred form of the invention, the casing includes biasing means to bias the test contact member towards its rest position. Such an arrangement provides a positive return force after the test probe is removed.

In another preferred form, the test contact member and the two walls are generally alongside each other with the test contact member between the two walls. This means that the test contact member will in use be deflected in one direction or another opposed direction, simplifying the overall construction.

The present invention also enables constructions to be prepared which are particularly advantageous in themselves. In its second aspect, the present invention therefore refers to certain such constructions in more detail.

In this second aspect, the present invention therefore provides a telecommunications apparatus including a conduction path segment from an exchange wire to a drop wire and a test port for testing that conduction path, the conduction path segment including a first and a second contact disposed within the apparatus in a non-contacting manner, the test port including a generally elongate test contact member adjacent to a wall member, the test contact member being held in a first position by at least one biasing means but deflectable therefrom to a second position on application of a test probe to the test contact member and the wall member, wherein the first and second contacts are electrically connected by a further contact when the test contact member is in the first position and are not so connected when the test contact member is in the second position.

Thus, when a test probe is connected to the line, the exchange wire and drop wire are disconnected. A third party seeking to gain unauthorised access to a telephone line will therefore be detectable In the form of a failed line. Meanwhile, an engineer is able to test the line on either the exchange wire side or the drop wire side without interference from equipment connected to the other side.

In this respect, it is preferred if there are two wall members, one either side of the test contact member, wherein the test probe can be applied to the test contact and either the first or second wall member respectively, the test contact member then being electrically connected either to the first or to the second contact according to which wall member is chosen. This allows an engineer to select which side of the circuit to test, i.e. a "look both ways" capability.

In one preferred form of this second aspect, the test contact member is the further contact. Thus, the first and second contacts are electrically connected via the test contact member. Displacement of the test contact member from its first position toward its second position thus disturbs this connection and breaks the connection.

In another preferred form of this aspect, the test contact member is not the further contact but is brought into contact therewith when in the second position, causing the further contact to lose its electrical contact with one of either the first or second contacts. Thus, deflection of the test contact member causes the further contact member to be displaced out of position, breaking the electrical contact between the first and second contacts.

In a preferred form of this aspect, the test probe is situated within an external case but accessible via an aperture in that casing. This serves to provide a measure of environmental protection.

In a further preferred version of all aspects, the aperture is of insufficient extent to permit a test probe to be engaged with the test contact only. This is preferably achieved by selecting a size for the test contact and for the aperture such that the test contact dimension is greater than a size which is 2 mm less than the width of the aperture. The result of this is that a test clip able to grip the test contact on either side (i.e. without deflecting it) would be of insufficient thickness to provide the necessary strength. It is therefore further preferred if the difference is less than 1.5 mm, with 1 mm being a still more preferred figure.

The aim is essentially to make the width of the aperture intermediate between the width of two jaws of the crocodile clip and those two jaws when clipped over the test contact member. Thus, only a single jaw can be fully inserted into the aperture, leaving the upper jaw to grip on the external wall adjacent the aperture. In this aspect, it is preferred if the test contact member has an enlarged head member. In a further preferred form, the aperture is sufficiently wide to allow a test probe to touch the test contact without engaging. This permits an engineer to make a temporary contact with the circuit and hence check whether it is in use prior to disconnecting it. At the same time, it prevents a permanent connection being made by a third party.

It is also preferred if the test contact member has a tapering section facing the aperture. This assists a test probe in deflecting the test contact member as it is inserted into the aperture. The included angle of the tapering section is preferably at lest twice the angle whose tangent equals the static coefficient of friction between the test contact member and the test probe.

Embodiments of the present invention will now be described, by way of example, with reference to the accompanying Figure, in which;

FIG. 1 is a vertical cross-section through a module according to a first embodiment of the present invention;

FIG. 1a is an enlarged version showing the test contact member 26 of FIG. 1;

FIG. 2 is a cross-section through the module being a second embodiment of the present invention;

FIG. 6 shows a third embodiment of the invention, during testing;

Figure 3:
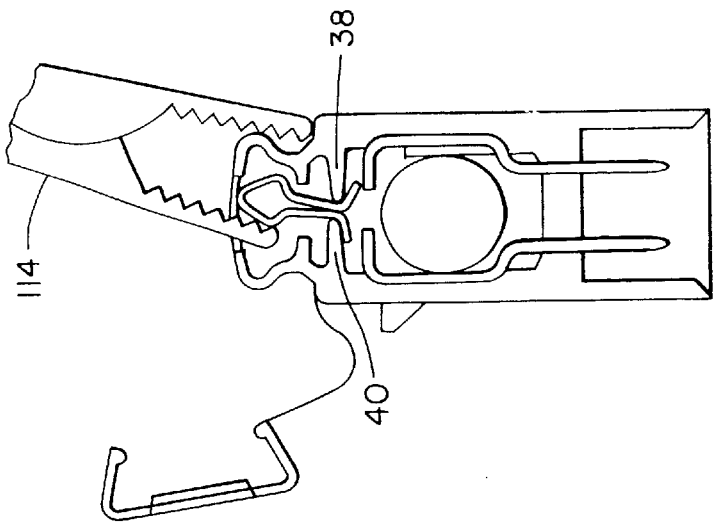
FIG. 3 is a view similar to that of FIG. 2 but with the lid open prior to testing.

FIG. 1 shows the first embodiment of the present invention, and will be described first. As is apparent from the nature of the invention, many of the components of the various embodiments share common parts. In the following description, those common parts will be referred to by a reference number below 100. Those parts which are unique to a particular embodiment will be referred to with a reference number of 100 or greater. Common parts between the embodiments will be referred to using the same reference number for all embodiments.

Referring to FIG. 1, an external case 10 is provided in the form of a module which can be attached to a larger item. The module 10 has a socket 12 which can engage with a suitably formed member on the larger piece of apparatus. A pair of electrical contacts 100, 102 extend from within the casing 10 into the socket area 12. When the module 10 is fitted, these extend into corresponding apertures on the larger item of apparatus and make electrical contact. Within the casing, an optional over voltage device 14 is situated so as to contact both electrodes 100, 102 and also an earth contact (not shown). A suitable over voltage device is a gas discharge tube, as shown. A ledge 16 is formed on one side of the module 10 so as to engage a corresponding recess formed in the larger apparatus to provide a more positive retention of the module 10.

At the top of the module 10 an aperture 18 is formed which provides access to an upper interior space 20. The upper interior space is bounded on either side by a first and second wall member 22, 24 respectively. A test contact member 26 is provided generally within the upper enclosed space 20 and is shown in more detail in FIG. 1a. being an enlarged version. The test contact member 26 is formed by suitable folding of a single continuous strip of metal, and has a bulbous head portion 28 originally at the centre of the strip, from the base of which extend two generally parallel adjacent leg portions 30, 32 which thereby form a waist portion. The bulbous head portion 28 narrows to a central tip. At the base of the test contact member the ends of the original metal strip are splayed outwardly to form a pair of contact legs 34, 36. These extend generally transversely over the waist portion, but are angled slightly downward.

Within the casing 10, a pair of biasing lips 38, 40 extend inwardly to define the lower bound of the upper enclosed space 20 and abut against the test contact member 26 at its waist portion. These biasing lips 38, 40 contact the upper surfaces of the contact legs 34, 36 and serve to hold the test contact member in a vertical rest position. Deflection of the test contact member 26 either side, toward one of the wells 22, 24 is possible, causing deformation of the biasing lips 38, 40. This deformation serves to bias the test contact member 26 towards its original rest position. Thus, the test contact member has a central rest position and two test positions in which it is deflected in one direction or the other away from the central rest position.

The aperture 18 is slightly wider than the bulbous head 28 of the test contact member 26, but is not sufficiently wide to allow a crocodile clip to be inserted into the upper enclosed space 20 and engaged onto the bulbous head. If a single leg of such a test probe is inserted, the tapering nature of the bulbous head 28 either side of the central tip will assist in deflecting the test contact member 28 away from its rest portion.

In this embodiment, a single electrical contact member 104 is provided, the ends of which form the electrical contacts 100, 102. This passes immediately beneath the contact feet 34, 36 of the test contact member 26, without contacting the same when the test contact member 26 is in its rest position. It is sufficiently close to the test contact member 26 such that when the same is deflected to a test position, as shown in FIG. 1, one or other of the contact feet 34, 36 will contact the electrical conductor 104, depending on the direction of tilt of the test contact member 26.

This enables an engineer to test a telephone line by simply clipping a crocodile clip onto the test contact member 26 and the wall member 22 or 24, causing contact to be made. The electrical conductor does not extend into the upper enclosed area 20, and is at least partially sealed from the outside world via the biasing lips 38, 40. It may however be advisable to include a layer of sealant gel or grease adjacent the lips 38, 40.

FIG. 2 shows a second embodiment of the invention. In this embodiment, the conductive element 104 is replaced with a pair of conductive members 106, 108, each of which extends into the recess 12 to provide contacts 110, 112. These contacts 106, 108 then extend upwardly within the module 10 and each terminate immediately beneath the test contact member 26 such that each makes contact with one of the contact feet 34, 36. The complete conductive path is therefore via the contact 106, the test contact member 26 and the contact 108.

Because the test contact member 26 is included as part of the conduction path, a further environmental protection must be provided above and beyond that of FIG. 1. Thus, a cap 42 is provided which clips onto the side walls 22, 24. A small pad of non-conductive elastic self-healing sealant gel 44 is provided on an inner surface of the cap 42 so as to cover the aperture 18 and prevent ingress of moisture etc. The cap 42 is secured to the module 10 by way of a flexible strop 46 attached both to the cap 42 and the module 10.

Figure 4:
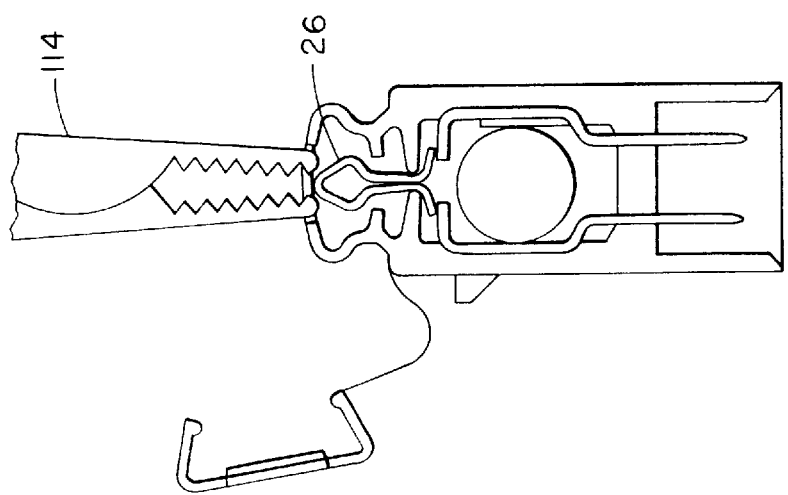
FIG. 4 shows the module of FIG. 3 at a first stage of testing.
Figure 5:
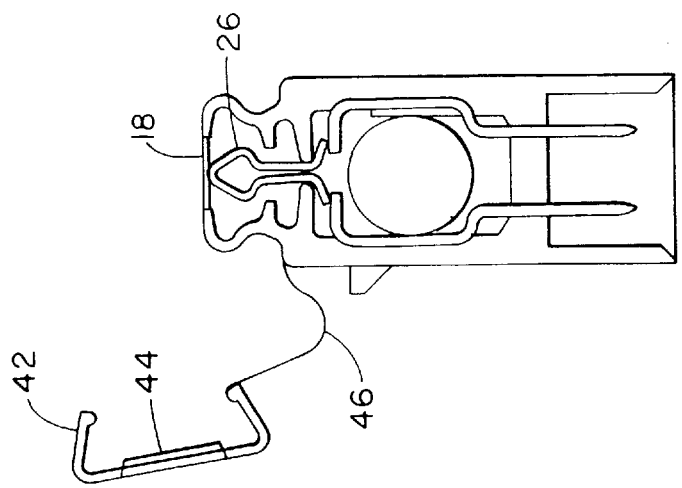
FIG. 5 shows the module of FIG. 3 in a second stage of testing.

FIGS. 3, 4 and 5 illustrate a test procedure for use with the embodiment shown in FIG. 2. In FIG. 3, the cap 42 has been removed to expose the aperture 18 and the test contact member 26 there beneath. The cap 42 cannot be lost because it dangles nearby by virtue of the strop 46. FIG. 4 shows a crocodile clip 114 with its jaws closed and illustrates that the tip thereof is just small enough to fit inside the aperture 18 and make contact with the head of the test contact member 26. Thus, an engineer can make a temporary electrical contact with the conduction path and listen to the circuit to ascertain whether the line is busy. If the line is busy, he may wish to discontinue the test. FIG. 5 shows the final step of the test, in which the crocodile clip 114 is removed from the position shown in FIG. 4, the jaws thereof are opened, and it is reapplied so as to grip the test contact member 26 and one of the side walls 22, 24. The gripping force of the crocodile clip is sufficient to deflect the test contact member 26 against the biasing of the biasing lips 38, 40, and this causes one of the contact feet 34, 36 to be lifted away from and lose electrical contact with one of the electrical conductors 108, 106 respectively. Thus, a test contact has been made with one of the incoming wires. To connect to the other incoming wire, the crocodile clip 114 can be clipped to the test contact member 26 and the other of the walls 22, 24.

It will be apparent from[ ]this description that a third party cannot make a permanent electrical contact using a crocodile clip since to do so will break the electrical contact. This will soon be noticed in the normal course of testing or use of the telecommunications system. It arises through the selection of sizes of the aperture 18 and the head portion 28 of the test contact member 26, in combination with the moveable nature of the head portion 28.

FIG. 6 shows a third embodiment of the present invention. As compared with the second embodiment, the contacts 106, 108 are replaced with contacts 116, 118 which are generally similar but stop short of contact with the test contact member 26. Instead, the contacts 116, 118 are each in contact with a bridging contact 120 which lies beneath the test contact member 26 and is biased upwardly by a biasing means (not shown) so as to remain in contact with the contacts 116, 118. Thus, when the test contact member 26 is deflected to a test position as shown in FIG. 6, one of the contact legs 34, 36 touches the bridging contact 120 and depresses it downward out of contact with one of the contact members 116, 118. The bridging contact 120 does however remain in contact with the other contact member 116, 118, allowing a test contact to be made therewith.

Figure 7A:
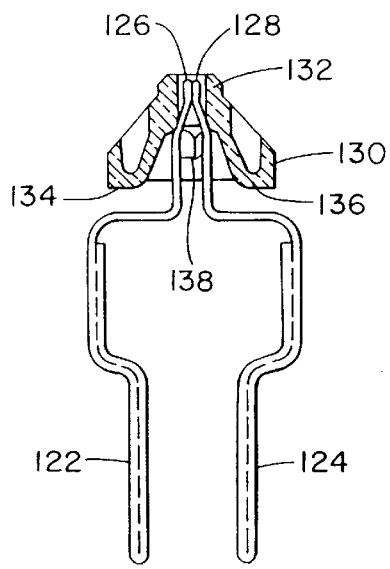
FIG. 7a shows detail of part of the inner features of the fourth embodiment.

FIGS. 7 to 10 show the fourth embodiment of the present invention. In this embodiment, electrical contacts 122, 124 extend from the socket area 12, around the over voltage device 14, and Into the upper interior space 20. In this area, the contacts 122, 124 are angled together and make contact via sprung contacts 126, 128. These are more clearly shown in FIG. 7a. When viewed from the side, the electrical contacts 122, 124 are of full width in their lower portions but narrow in the area extending out of the upper interior space 20. This allows them to pass within a vertical slot formed centrally within the sealing lips 38, 40 and in the test contact member 26. Thus, these items are designated 38a, 40a and 26a respectively in FIGS. 7 onwards.

A contact carrier 130 is fitted around the contacts 126, 128. This comprises a body portion 132 with a central vertical through-hole within which rests the contacts 126, 128, and a pair of downwardly depending feet 134, 136. A bar 138 passes through the central aperture between the contacts 126, 128 below their point of electrical contact. In the rest position, therefore, the contacts 126, 128 pass through the central aperture either side of the bar 138 whereupon they converge and make electrical contact within the aperture.

The positioning of the contact carrier 130 within the casing 10 is such that the feet 134, 136 lie immediately below the sealing lips 38a, 40a, just above the horizontal extents of the feet 34, 36 of the test contact member 26a.

Figure 7:
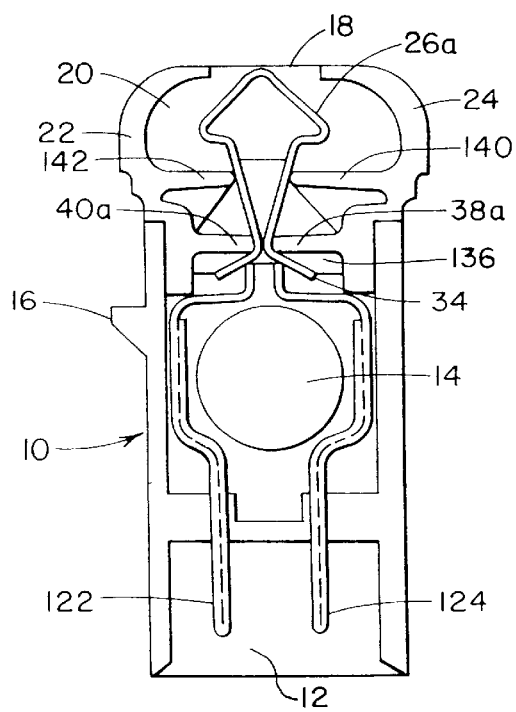
FIG. 7 is a vertical cross-section through a module according to a fourth embodiment of the present invention.

It will be seen from FIG. 7 that in its normal rest position the test contact member 26a is held slightly above he contacts 122, 124 by virtue of the lips 38a. 40a. Thus, in its rest position, the test contact member 26a does not make electrical contact with any other part.

Additional lips 140, 142 within the upper interior space 20 act on either side of the contact carrier 130 to bias it downwardly.

Figure 8:
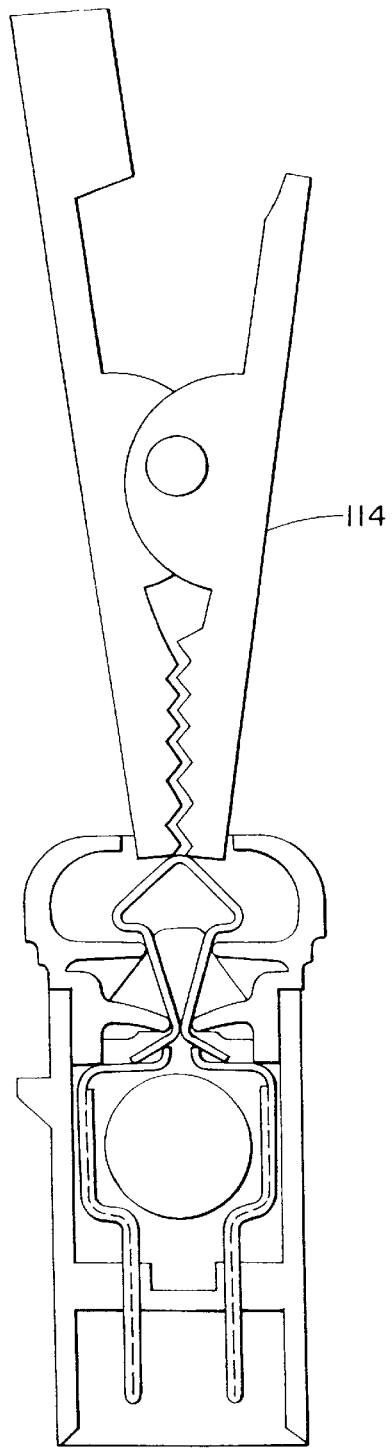
FIG. 8 shows the module of FIG. 7 at a first stage of testing.

FIG. 8 shows the first stage of testing, in which a crocodile clip 114 is pushed into the aperture 18 to press vertically on the test contact member 26a. This presses the test contact member 26a downwardly into contact with the horizontal extents of both contact members 122, 124, whereupon the engineer can listen to the line to ensure that it is not busy. It will be seen that, as in the previous embodiments, the aperture 18 is of insufficient extent to allow the crocodile clip 114 to make permanent contact with the bulbous head of the test contact member 26a.

Figures 9, 10:
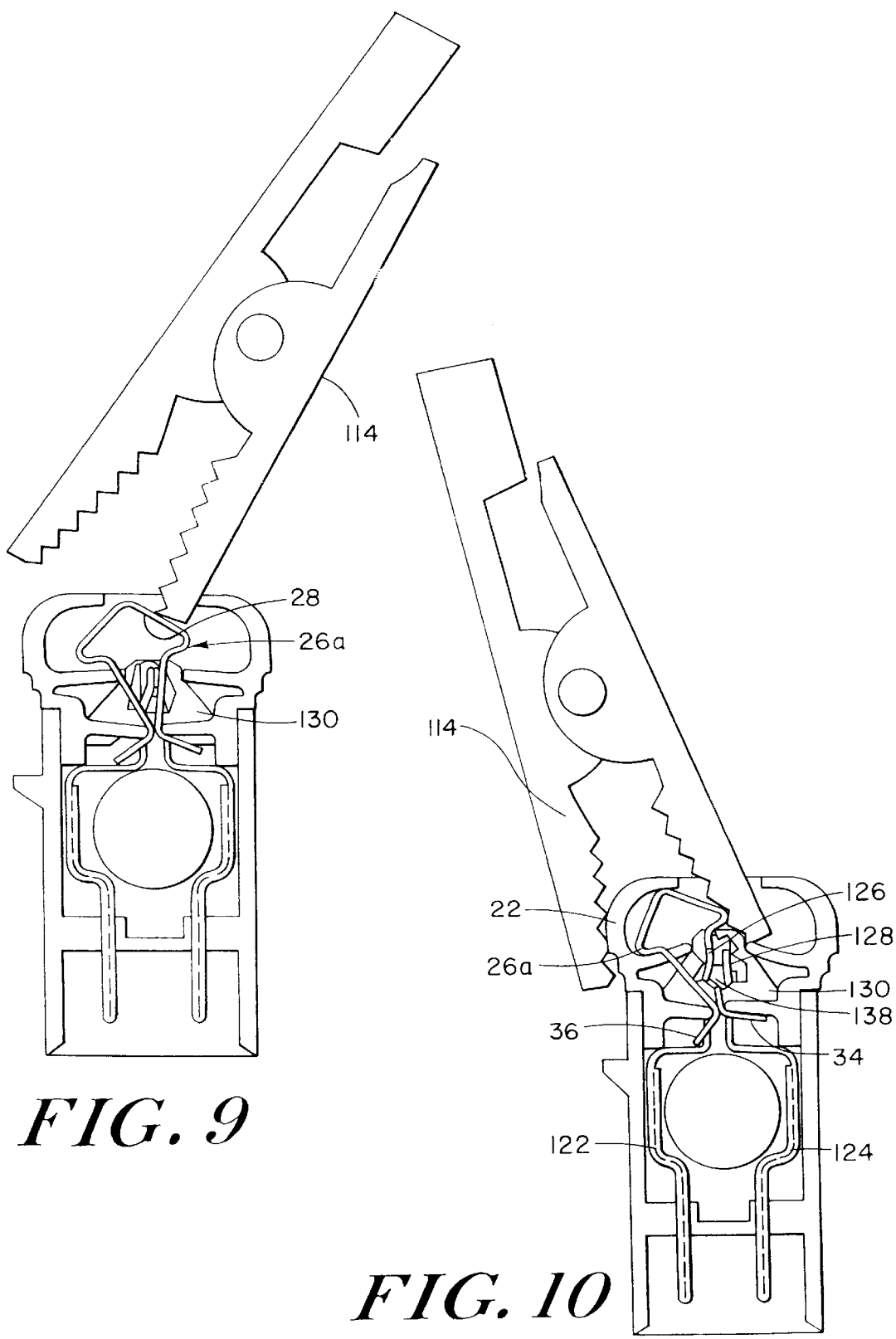
FIG. 9 shows the module of FIG. 7 just before a second stage of testing.
FIG. 10 shows the module of FIG. 7 during the second stage of testing.

FIGS. 9 and 10 show the second stage of testing. In FIG. 9 the crocodile clip is opened and introduced into the aperture 18 at an angle so as to press on one side of the head portion 28 of the test contact member 26a. This allows the crocodile clip 114 then to be rotated about its point of contact with the test contact member 26a, and engaged with the head portion 28 thereof and side wall 22 or 24. The spring action of the crocodile clip 114 then firmly biases the test contact member 26a towards that wall, thus deflecting it to the test position shown in FIG. 10. In this position, one leg 36 of the test contact member 26a makes contact with a contact member 122. The other leg 34 is deflected correspondingly upwardly and forces the foot 136 of the contact carrier 130 upward. This in turn causes the body portion 132 thereof to move upwardly, bringing the bar 138 up further between the contacts 126, 128, forcing the latter apart and breaking electrical contact between the contact members 122 and 124.

Thus, in the test position, the conductive path is broken and a test contact is made with one side. Test contact can similarly be made with the other side by clipping the crocodile clip around the test contact member 26a and the alternative wall 24.

This embodiment offers a significant advantage over the third embodiment shown in FIG. 6, in that the crocodile clip is attached to the wall pointing in the direction in which the circuit is to be tested. Thus, use is significantly more straightforward for engineers.

It will be appreciated that through the above-described embodiments, a module can be created which will cater for substantially all specifications laid down by telecommunications companies. Those parts which require an expensive investment are common to all embodiments and repeat investment is therefore not required. The above-described embodiments are of course merely examples of the invention, which is not limited thereto.

What is claimed is:

1. A telecommunications apparatus comprising an external plastics casing having a conductive path for a telecommunications signal, and a test contact within the casing having an electrically conductive member, the casing including a pair of wall members and an aperture therebetween providing access to the test contact member, thereby allowing a test probe to be attached to the test contact member and one wall member of the pair thereby deflecting the test contact member from a rest position towards a test position; the conductive path being a pair of conductors not in mutual contact but each in contact with the test contact member when the latter is in the rest position, one of the pair only being in contact with the test contact member when disposed in a test position.

2. A telecommunications apparatus comprising an external plastics casing having a conductive path for a telecommunications signal, and a test contact within the casing having an electrically conductive member, the casing including a pair of wall members and an aperture therebetween providing access to the test contact member, thereby allowing a test probe to be attached to the test contact member and one wall member of the pair thereby deflecting the test contact member from a rest position towards a test position; the conductive path being a pair of conductors not in mutual contact but each in contact with a third conductive member when in its rest position, none of the three being in contact with the test contact member when the latter is in its rest position, deflection of the test contact member to a test position bringing said test contact member into contact with the third conductive member and causing said test contact member to be deflected from said rest position to said test position in which said test contact member is not in contact with at least one of the pair of conductors.

3. A telecommunications apparatus comprising an external plastics casing having a conductive path for a telecommunications signal, and a test contact within the casing having an electrically conductive member, the casing including a pair of wall members and an aperture therebetween providing access to the test contact member, thereby allowing a test probe to be attached to the test contact member and one wall member of the pair thereby deflecting the test contact member from a rest position towards a test position; the conductive path being a continuous path not in contact with the test contact member when the latter is in the rest position, which is broken when the test contact member is in the test position, one part of the path then being in contact with the test contact member.

4. A telecommunications apparatus comprising an external plastics casing having a conductive path for a telecommunications signal, and a test contact within the casing having an electrically conductive member, the casing including a pair of wall members and an aperture therebetween providing access to the test contact member, thereby allowing a test probe to be attached to the test contact member and one wall member of the pair thereby deflecting the test contact member from a rest position towards a test position; the conductive path being one selected from
 (a) a contiguous path adjacent the test contact member but not in contact therewith except when the test contact member is in a test position;
 (b) a pair of conductors not in mutual contact but each in contact with the test contact member when the test contact member is in the rest position, one of the pair only being in contact with the test contact member when the test contact member is in a test position;
 (c) a pair of conductors not in mutual contact but each in contact with a third conductive member when said test contact member is in said rest position, none of the three being in contact with the test contact member when the test contact member is in said rest position, deflection of the test contact member to said test position bringing it into contact with the third conductive member and causing said test contact member to be deflected from said rest position to said test position in which said test contact member is not in contact with at least one of the pair of conductors.

5. Apparatus according to any one of claims 2–4, wherein the conductive members are formed of a deformed metal strip.

6. Apparatus according to any one of claims 1–4 wherein the casing includes biasing means to bias the test contact member toward its rest position.

7. Apparatus according to any one of claims 1–4 wherein the test contact member and the two walls are generally alongside each other with the test contact member between the two walls.

8. A telecommunications apparatus comprising a conductive path segment from an exchange wire to a drop wire and a test port for accessing that conductive path, the conductive path segment including a first and a second contact disposed within the apparatus in a non-contacting manner, the test port including a generally elongate test contact member adjacent to a wall member, the test contact member being held in a first position by at least one biasing means but deflectable therefrom to a second position on application of a test probe to the test contact member and the wall member, wherein the first and second contacts are electrically connected by a further contact when the test contact member is in the first position and are not so connected when the test contact member is in the second position.

9. Apparatus according to claim 8 having two wall members, one either side of the test contact member, wherein the test probe can be applied to the test contact and either the first or second wall member respectively, the test contact member then being electrically connected either to the first or to the second contact according to which wall member is chosen.

10. Apparatus according to claim 8 wherein the test contact member is the further contact.

11. Apparatus according to claim 8 wherein the test contact member is not the further contact but is brought into contact therewith when in the second position, causing the further contact to lose its electrical contact with one of either the first or second contacts.

12. Apparatus according to claim 11 wherein the test probe is situated within an external case but accessible via an aperture in that casing.

13. Apparatus according to claim 8 wherein the aperture is of insufficient extent to permit a test probe to be engaged with the test contact only.

14. Apparatus according to claim 13 wherein the test contact dimension is greater than a size which is 2 mm less than the width of the aperture.

15. Apparatus according to claim 8 wherein the test contact member has an enlarged head member.

16. Apparatus according to claim 8 in which the aperture is sufficiently wide to allow a test probe to touch the test contact without engaging.

17. Apparatus according to claim 8 in which the test contact member has a tapering section facing the aperture.

18. Apparatus according to claim 17 wherein the included angle of the tapering section is at least twice the angle whose tangent equals the static coefficient of friction between the test contact member and the test probe.

19. A telecommunications apparatus comprising a conductive path segment from an exchange wire to a drop wire and a test port for accessing that conductive path, the conductive path segment including a first and a second contact disposed within the apparatus such that electrical contact is made therebetween, the apparatus including a movable contact carrier situated adjacent the point of electrical contact, the test port including a generally elongate test contact member adjacent to a wall member, the test contact member being held in a first position by at least one biasing means but deflectable therefrom to a second position on application of an test probe to the test contact member and the wall member, deflection of the test contact member causing movement of the contact carrier such as to break the electrical contact between the first and second contacts.

20. A telecommunications connector comprising:
a first unit having contacts for both an exchange wire and a drop wire respectively; and
a module connectable to the first unit and being in accordance with any one of claims 1–4 or 8–19.

* * * * *